United States Patent [19]

Shu et al.

[11] Patent Number: 5,384,503
[45] Date of Patent: Jan. 24, 1995

[54] SRAM WITH CURRENT-MODE READ DATA PATH

[76] Inventors: Lee-Lean Shu; Kurt Knorpp, both of c/o Sony Microelectronics Design Center, Sony Corporation, San Jose, Calif. 95134; Katsunori Seno, c/o Device Tech. Div., ULSI R&D Group, Atsugi Tech Center, Sony Corp., Atsugi-shi, Kanagawa-ken, Japan

[21] Appl. No.: 942,296

[22] Filed: Sep. 9, 1992

[51] Int. Cl.⁶ .............................................. H03K 5/22
[52] U.S. Cl. ........................................ 327/52; 365/207
[58] Field of Search .................. 365/190, 207, 208; 307/530, 350, 355; 330/252, 253, 260, 261, 257

[56] References Cited

U.S. PATENT DOCUMENTS 4,888,503 12/1989 Young ................................ 307/530
4,899,312 2/1990 Sato ................................ 365/230.02
5,036,231 7/1991 Kanbara .............................. 307/530
5,216,380 6/1993 Carbou ............................... 330/253

Primary Examiner—Eugene R. LaRoche
Assistant Examiner—A. Zarabian
Attorney, Agent, or Firm—Hill, Steadman & Simpson

[57] ABSTRACT

A current sensing, cascadable differential amplifier has a special bias circuit that provides a low impedance input and a high impedance output, whereby plural stages may be connected in cascade. Optionally, active current sources are used as pull-ups for the data lines, to increase the output impedance and improve the data line common mode level. The amplifier performs as a current sensing sense amplifier in a large scale, fast access semiconductor memory and in this application, the memory does not need equalizing clock signals, nor is the access time slowed materially in the plural cascade stages.

9 Claims, 3 Drawing Sheets

SRAM WITH CURRENT-MODE READ DATA PATH

FIELD OF THE INVENTION

The present invention relates to static random access memories (SRAMs) and more particularly to SRAMs with a current-mode data path.

BACKGROUND

It has become increasingly difficult to generate and distribute short duration clock pulses on a large scale, for large scale high-speed memories. Such pulses have been required for equalization of the bit lines, etc., but the provision for such pulses prolongs access times and degrades performance of the memory. A current-mode read data path, however, eliminates the need for such clock pulses. Several amplifiers have been described in the literature, but the use of positive feedback to reduce the amplifier input resistance has limited the use of this type of amplifier to single-ended, single stage applications.

A description of a current-mode data path for an SRAM was published in the Apr. 19, 1991 edition of the IEEE Journal of Solid State Circuits. The paper, "Current-Mode Techniques For High-Speed Real Side Circuits", by E. Seevnick, et al., proposes the use of two complementary current amplifiers as local and global sense amplifiers in an SRAM data path. The detailed design of these amplifiers is, however, different from the amplifier of the present invention. Another paper, "Fast CMOS Current Amplifier And Buffer Stage" by Temes and Ki describes a similar single stage current amplifier.

SUMMARY OF THE INVENTION

The present invention employs two cascade complementary differential current amplifiers in a readout circuit for an SRAM. The amplifiers employ special bias circuits and provide improved amplifier operation, allowing them to be connected in series or cascade. A small amplifier differential input resistance reduces the voltage swing of differential lines and thus eliminates the need for equalization clocks.

Whereas in the prior art, the single-ended amplifier has been unsuitable for SRAM data path applications where several stages of differential amplification are required, the amplifiers of the present invention employ a unique bias circuit which improves operation of the amplifiers and extends their use to differential cascaded applications, such as in an SRAM read data path.

BRIEF DESCRIPTION OF THE DRAWINGS

Reference will now be made to the accompanying drawings in which.

BRIEF DESCRIPTION OF THE PREFERRED EMBODIMENTS

Figure 1:
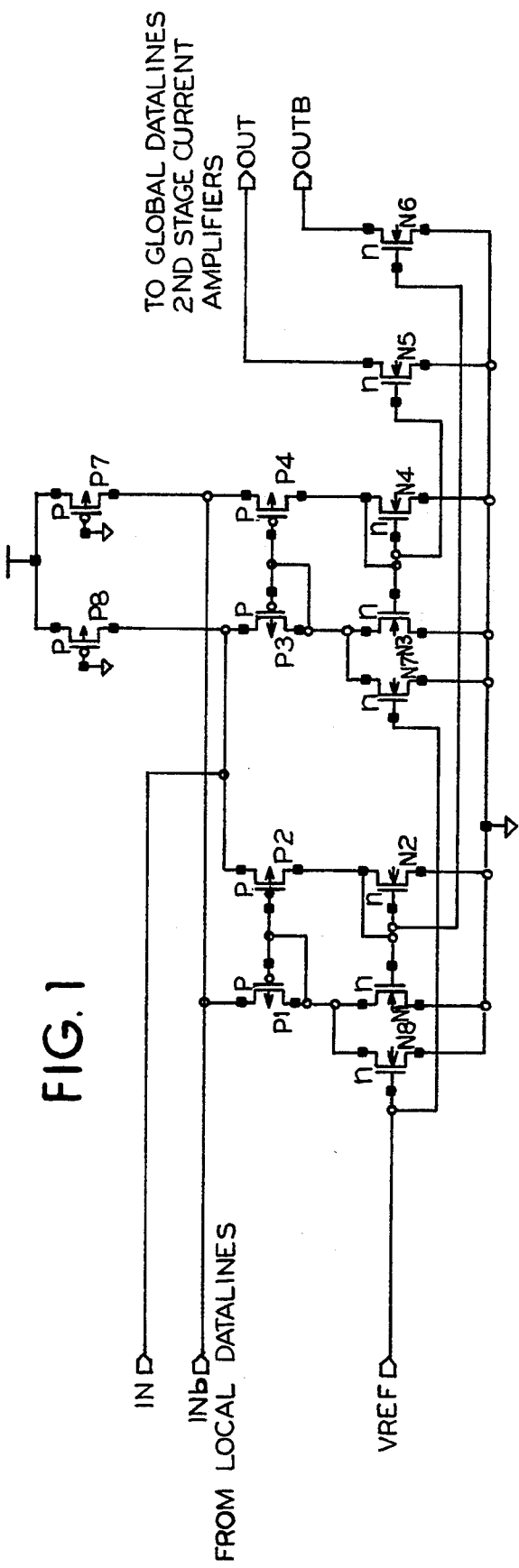
FIG. 1 is a schematic diagram of a first stage current amplifier for the read data path of an SRAM.

Referring now to FIG. 1, the first stage of an amplifier embodying the present invention is illustrated. It uses four PMOS transistors P1–P4 as input devices, and four NMOS transistors N1–N4 as load devices. NMOS transistors N5 and N6 serve as buffers which isolate the first stage output from the high capacitance global data lines. The circuit of FIG. 1 incorporates a bias circuit composed of transistors N7 and N8, with their gate electrodes connected to a reference voltage $V_{REF}$. PMOS transistors P7 and P8 serve the dual purpose of providing amplifier bias to Vcc, and as data line pull-ups.

Figure 2:
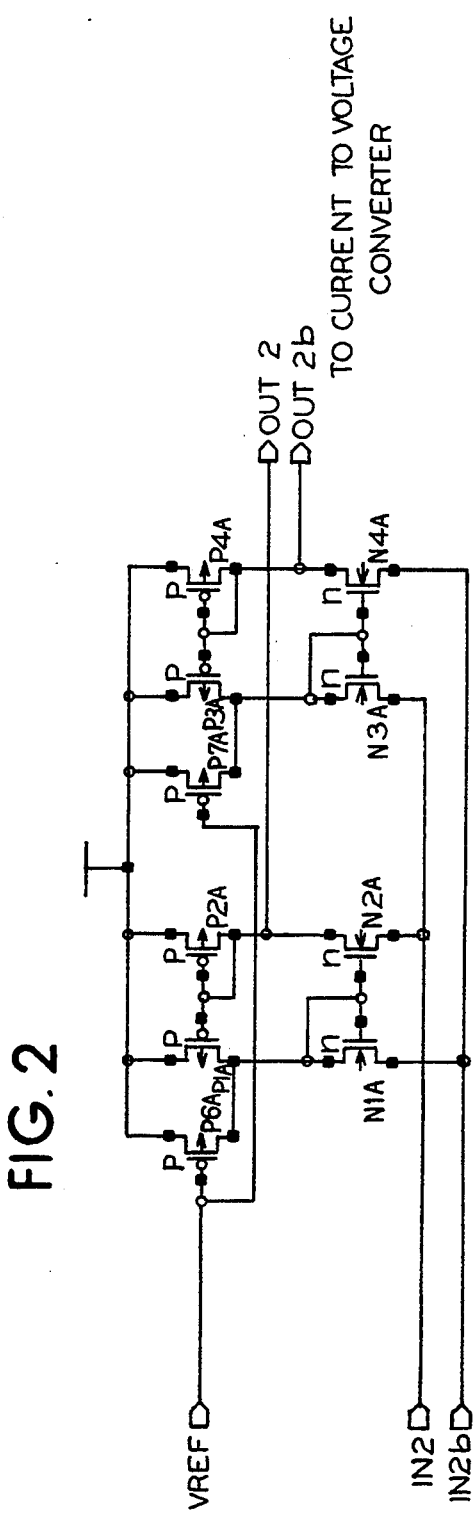
FIG. 2 is a second stage current amplifier for the read data path of an SRAM.

The second stage of the amplifier is illustrated in FIG. 2. it uses NMOS transistors N1A–N4A as input devices, and PMOS transistors P1A–P4A as load devices. The bias circuit is composed of transistors P6A and P7A, having their gate electrodes connected to a reference voltage $V_{REF}$.

Figure 3:
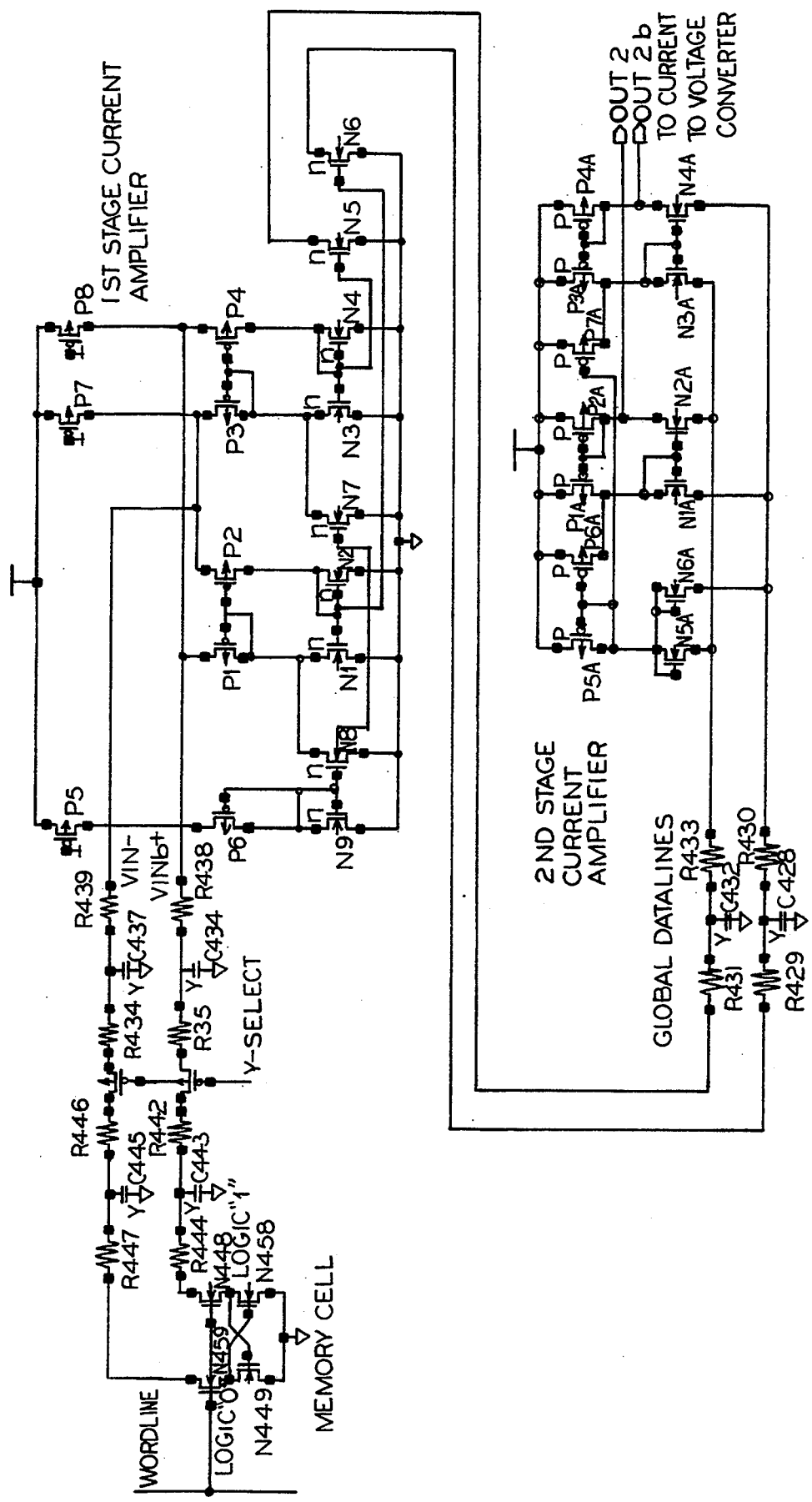
FIG. 3 is a schematic circuit diagram of a portion of a memory cell array, with the two stage amplifier of the present invention.

FIG. 3 illustrates the manner in which the first and second stages are connected in an SRAM read data path. In the implementation illustrated in FIG. 3, the voltage reference circuits for the first stage are formed by transistors P5, P6 and N9, and the voltage reference circuits for the second stage comprise resistors P5A, N5A and N6A.

Figure 4:
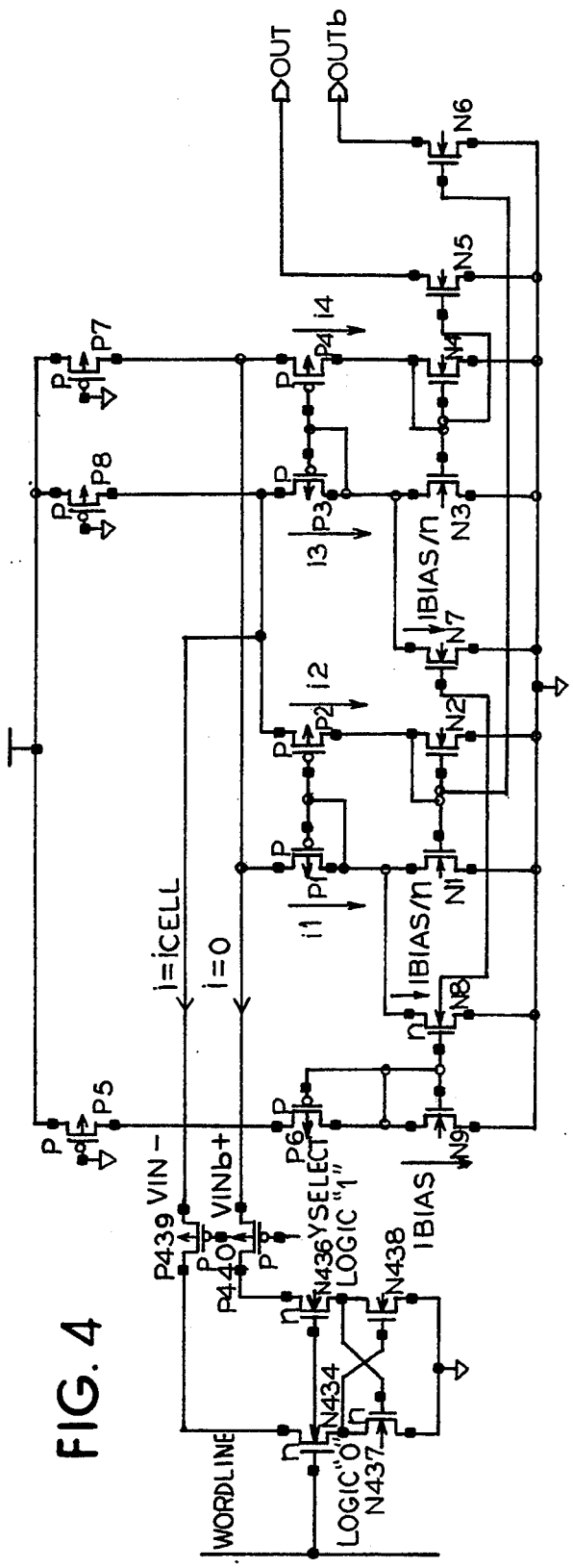
FIG. 4 is a schematic circuit diagram of the first stage of a current amplifier of the present invention.

FIG. 4, which illustrates a schematic diagram of the first stage, illustrates the manner in which the amplifiers operate. Both stages operate identically. When the PMOS and NMOS devices have aspect ratios, such that $$\frac{W/L_{P2/P4}}{W/L_{P1/P3}} * \frac{W/L_{N1/N3}}{W/L_{N2/N4}} = 1$$

then differential input voltage of the amplifier $V_{IN} - V_{INB}$, is forced to zero. When $V_{IN} = V_{INB}$, the current $I_2$ through the input device P2 is a multiple of the current $I_1$ through the input device P1. Similarly, the current $I_4$ through P4 is a multiple of the current $I_3$, through P3. This gives rise to two beneficial characteristics of the amplifier, namely a small differential input resistance, and current repetition. These features make the amplifier useful for reading the contents of an SRAM memory cell. In such an application, the small input resistance of the amplifier limits the swing of the differential data lines, and thus eliminates the need for equalization clocks, which are typically generated at the time of address detection. The amplifier current repetition capability can be used to isolate the memory cell from high capacitance bit lines and data lines, thus reducing data path delay times.

Figure 5:
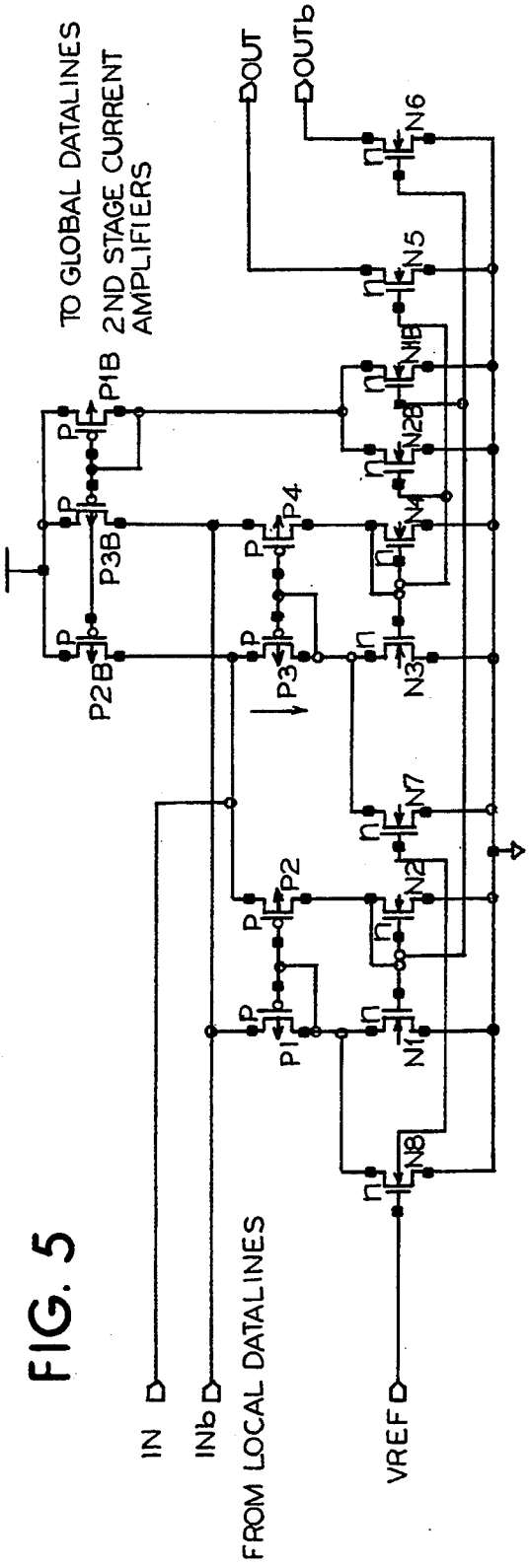
FIG. 5 is a schematic circuit diagram of the first stage of a current amplifier according to an alternative embodiment of the present invention, with a current source pull-up circuit.

There is a problem which arises when using the amplifier in FIG. 4 for SRAM implications. The current repetition property prevents the use of the amplifier in circuits that require multiple stages of sensing. When reading an SRAM memory cell, current flows in only one of two differential input data lines. If the amplifier is designed to meet the above criteria, no current will flow through one side of the amplifier. This has several consequences. First, it may be difficult to restart the amplifier when reading opposite data. Second, with one side of the amplifier shut down, it becomes impossible to drive successive amplifier stages. This situation is illustrated in FIG. 5. When reading the logic zero from a memory cell, current flows in an input device P3. With the amplifier designed as above, a current of equal magnitude will flow an input device P4. Conversely, no current flows in input devices P1 and P2. With this absence of current, output devices N1 and N2 and buffer device N6 begin to cut off. When these transistors near cutoff, transfer of current to the second stage amplifier is inhibited, causing either an unacceptable delay in reading the memory cell contents, or an improper read of the memory cell data.

Therefore, it is necessary to provide a bias circuit that keeps all the transistors operating deeply in the saturation region, preventing the shut down of one of the amplifiers and insuring current transfer to subsequent stages.

The circuit of FIG. 4 illustrates such a bias circuit. It provides means for generating a current which is a fraction of the "on side" amplifier current. This is accomplished by using a current mirror bias circuit, composed of PMOS transistors P5 and P6 and NMOS transistors N7, N8 and N9. Transistors P5, P6 and P9 have the same W/L ratios as the amplifier input, load and data line load transistors. Transistors N8 and N9, however, are scaled to transfer a fraction of this current to both halves of the amplifier. By creating a current flow, the "off side" of the amplifier is prevented from shutting down. By using this circuit, all transistors remain biased in the saturation region during a read operation. The amplifier can perform successive read operations of opposite data, and current can be successfully transferred to additional stages without read errors or additional delays.

The data line pull-up circuit illustrated in FIG. 1 uses PMOS transistors P7 and P8 biased in the linear region as pull-ups. The output gain of the amplifier can be increased by increasing the value of the resistance of the pull-up device. Besides providing amplifier bias to Vcc, the other function of the data line pull up device is to keep the data line DC common-mode voltage above the voltage necessary to write the memory cell. Using the linear PMOS load, the data line common-mode voltage drop is proportional to the value of R, namely the resistance of the pull-up device. The larger the value of R, the lower the data line common-mode voltage. Thus, the linear PMOS circuits limits the current gain in order to achieve the necessary data line DC common-mode voltage level.

The pull-up circuit illustrated in FIG. 5 employs a current source pull-up circuit. Here PMOS transistor P1B and NMOS transistor N1B generate a bias current. A multiple of the bias current is transferred to the data line and amplifier by PMOS devices P2B and P3B. The current source provides the necessary current to maintain the data line common-mode level, but has a much higher output impedance than the linear PMOS pull-up devices. Simulations have shown that for the same data line common-mode voltage level, the current source load circuit increases the current gain of the amplifier 25% over the gain of the amplifier with the linear PMOS pull-ups.

It will be apparent to those skilled in the art that various modifications and additions may be made in the apparatus of the present invention, without departing from the essential features of novelty thereof, which are intended to be defined and secured by the appended claims.

What is claimed is:

1. A current detecting differential amplifier having complementary outputs and low input impedance, comprising, in combination: first and second input transistors each connected to receive one of two differential current inputs, respectively, for providing complementary outputs corresponding to said differential inputs, means for cross coupling said first and second input transistors to provide positive feedback and thereby lower the input impedance thereof, bias means for biasing both of said first and second input transistors into conduction, whereby both of said input transistors remain conducting irrespective of the levels of said differential inputs, and first and second output transistors connected to said first and second input transistors for supplying said complementary output signals with a high output impedance, whereby plural stages of the amplifier may be connected in cascade without increasing the response time thereof more than a minor amount.

2. A current detecting differential amplifier comprising first, second, third and fourth transistors of one conductivity, and fifth, sixth, seventh and eighth transistors of the opposite conductivity, the first and fifth transistors being connected in series between one input line and a common reference potential, said fourth and eighth transistors being connected in series between said one input line and said common reference potential, said second and sixth transistors being connected in series, and said third and seventh transistors being connected in series, both between a second input line and said common reference potential, means for deriving a first output signal from a junction of said second and sixth transistors, means for deriving a second output signal from a junction of said fourth and eighth transistors, means connecting a junction of said first and fifth transistors to a control input of each of said first and second transistors, means connecting the junction of said second and sixth transistors to a control input of each of said fifth and sixth transistors, means for connecting the junction of said third and seventh transistors to a control input of each of said third and fourth transistors, means for connecting the junction of said fourth and eighth transistors to a control input of each of said seventh and eighth transistors, first bias means connected between the junction of said first and fifth transistors and said common reference potential, and second bias means connected between the junction of said third and seventh transistors and said common reference potential.

3. The current detecting differential amplifier of claim 2, wherein said first and second bias means each comprise a bias transistor, and including means for connecting control inputs of said bias transistors to a second reference voltage.

4. The current detecting differential amplifier according to claim 1, including a pair of pull-up transistors connected between each of said differential current inputs and a source of potential, and means for biasing both of said pull-up transistors in their linear region.

5. The current detecting differential amplifier according to claim 1, including a pair of pull-up transistors connected between each of said differential inputs and a source of potential, and a bias current source connected to a control input of each of said pull-up transistors.

6. A current detecting differential amplifier having complementary outputs and low input impedance, comprising, in combination: first and second input transistors each connected to receive one of two differential current inputs, respectively, for providing complementary outputs corresponding to said differential inputs, means for cross coupling said first and second input transistors to provide positive feedback and thereby lower the input impedance thereof, bias means for biasing both of said first and second input transistors into conduction, whereby both of said input transistors remain conducting irrespective of the levels of said differential inputs, and first and second output transistors connected to said first and second input transistors for supplying said complementary output signals with a high output impedance, whereby plural stages of the amplifier may be connected in cascade without increasing the response time thereof more than a minor amount;

a pair of pull-up transistors connected between each of said differential inputs and a source of potential, and a bias current source connected to a control input of each of said pull-up transistors, said bias current source comprising first and second bias transistors connected in series between said source of potential and a common reference potential, and means for connecting a junction of said first and second bias transistors to control inputs of each of said pull-up transistors.

7. The current detecting differential amplifier of claim 6, including means for connecting the junction of said first and second bias transistors to a control input of said first bias transistor.

8. The current detecting differential amplifier of claim 6, including means for connecting a control input of said second bias transistor to a first output of said differential amplifier.

9. The current detecting differential amplifier of claim 8, including a third bias transistor connected between the junction of said first and second bias transistors and said common reference potential, and means for connecting a control input of said third bias transistor to a second output of said differential amplifier.

* * * * *